US010636818B2

(12) United States Patent
Piemonte (10) Patent No.: US 10,636,818 B2
(45) Date of Patent: Apr. 28, 2020

(54) SEMICONDUCTOR DEVICE AND SENSOR INCLUDING A SINGLE PHOTON AVALANCHE DIODE (SPAD) STRUCTURE

(71) Applicant: Avago Technologies International Sales Pte. Limited, Singapore (SG)

(72) Inventor: Claudio Piemonte, Regensburg (DE)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/945,490

(22) Filed: Apr. 4, 2018

(65) Prior Publication Data

US 2019/0312070 A1 Oct. 10, 2019

(51) Int. Cl.
| H01L 27/144 | (2006.01) |
| H01L 31/02 | (2006.01) |
| H01L 31/107 | (2006.01) |
| H01L 31/028 | (2006.01) |
| H01L 29/66 | (2006.01) |

(52) U.S. Cl.
CPC .... *H01L 27/1446* (2013.01); *H01L 29/66113* (2013.01); *H01L 31/02005* (2013.01); *H01L 31/028* (2013.01); *H01L 31/02027* (2013.01); *H01L 31/107* (2013.01)

(58) Field of Classification Search
CPC ............. H01L 31/107; H01L 27/14643; H01L 27/1446; H01L 29/66113; H01L 31/02027; G01N 21/64
See application file for complete search history.

(56) References Cited

U.S. PATENT DOCUMENTS

| 9,178,100 | B2 | 11/2015 | Webster et al. |
| 9,466,631 | B2 | 10/2016 | Fallica et al. |
| 9,773,930 | B2 | 9/2017 | Motta et al. |
| 2004/0013367 | A1 | 1/2004 | Herbert |
| 2011/0272561 | A1* | 11/2011 | Sanfilippo ........... H01L 27/1446 250/214.1 |
| 2015/0200222 | A1* | 7/2015 | Webster ................ H01L 31/107 250/208.1 |
| 2016/0254310 | A1* | 9/2016 | Yagi ................... H01L 27/14663 257/435 |
| 2018/0019268 | A1 | 1/2018 | Zhang et al. |

FOREIGN PATENT DOCUMENTS

WO WO 2008/011617 1/2008

* cited by examiner

*Primary Examiner* — Farun Lu
(74) *Attorney, Agent, or Firm* — Sheridan Ross P.C.

(57) ABSTRACT

A semiconductor device, sensor, and array of SPAD cubes are described. One example of the disclosed sensor includes at least one Single Photon Avalanche Diode (SPAD) cube established in a substrate, the at least one SPAD cube including a photosensitive area that is configured to produce an electrical signal in response to light impacting the photosensitive area, where the photosensitive area is positioned at a first side of the at least one SPAD cube, a contact that receives the electrical signal, where the contact is positioned at a second side of the at least one SPAD cube that opposes the first side of the at least one SPAD cube, and at least one trench that spans an entire thickness of the substrate thereby electrically and optically isolating the at least one SPAD cube from adjacent SPAD cubes.

17 Claims, 8 Drawing Sheets

SEMICONDUCTOR DEVICE AND SENSOR INCLUDING A SINGLE PHOTON AVALANCHE DIODE (SPAD) STRUCTURE

FIELD OF THE DISCLOSURE

The present disclosure is generally directed toward a semiconductor device and particularly directed toward Silicon Photomultipliers (SiPM) and/or Single-Photon Avalanche Diode (SPAD) structures.

BACKGROUND

Single-photon avalanche photodiodes (SPADs) are becoming of wide use in many domains, such as nuclear medicine, radiation detection in safety and security, biology and Lidar. The SPADs can be produced in custom microfabrication technology as well as in standard CMOS. The first approach allows a technology development aimed at optimizing the sensor performance in terms of efficiency and noise. The second approach allows the integration of intelligence directly on the photo-sensor.

A very interesting solution merging the benefits of the two above-mentioned technologies is offered by the high-density three-dimensional (3D) interconnection, which is widely used in image sensors. Each SPAD of the array can be read-out independently with a connection placed opposite to the light entrance side. A challenging aspect of the 3D approach is to provide an independent SPAD contact access opposite to the illumination side. Currently, there are mainly two approaches: Through Silicon Vias (TSVs) and back side illumination (BSI). In the first case (TSV), conductive pillars going from one side to the other are placed close to each element bringing the independent front side electrode to the back. The pillars are isolated from the silicon surrounding them. In the second case (BSI), the entrance window is placed opposite to the structured side.

The TSV approach requires many technological steps and it usually causes a loss of sensitive area, especially for small SPADs. BSI requires a complete redesign of the current SPAD technologies and could lead to some drawbacks such as increased optical cross-talk and loss of detection efficiency.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-5, various configurations of semiconductor devices, silicon photomultipliers, silicon photomultiplier circuits, light sensors, and the like are depicted and described. Although some of the devices depicted in the figures correspond to intermediate devices or portions of devices, one of ordinary skill in the art will appreciate that any of the devices or systems can be considered a semiconductor device, a sensor, or silicon photomultiplier/SPAD without departing from the scope of the present disclosure.

One aspect of the present disclosure is to provide a simple and efficient solution to independently connect the front-side illuminated SPADs or small group of SPADs (e.g., mini-SiPMs) of an array from the backside allowing for a 3D interconnection to a CMOS Application-Specific Integrated Circuit (ASIC) keeping the same electro-optical performance of current devices.

In some embodiments, a silicon photomultiplier (SiPM) is disclosed. The SiPM is a compact array of SPADs connected in parallel. Only two connections per several square millimeters are required. Such a simple scheme allows the maximization of the sensitive area: latest devices have a fill factor larger than 70%.

In one example, the starting material is a silicon wafer constructed with a highly-doped substrate and a lightly doped layer on top. Such a wafer may be referred to as an epitaxial (epi) wafer since it is the most practical method of realization. An epi layer may refer to the lowly doped part of the epi wafer. The epi layer is the active area of the silicon and it is fully depleted thanks to a junction created within the epi layer. The SPADs, in some embodiments, are separated by trenches which provide electrical isolation of the top layers (junctions) as well as optical isolation (mitigation of optical cross-talk). Each SPAD may also have a series quenching resistor integrated on the top surface. The resistors are connected together through a metal layer which is electrically accessible to bias the diodes. On the bottom side, the substrate creates the second common electrode for all SPADs. A metal electrode is placed on the bottom surface.

The SiPM architecture disclosed herein is simple but is conceived and developed to maximize the electro-optical performance. For this reason it is important to preserve the main features when designing a structure with a high-density interconnection with independent SPAD accessibility. In particular, the features of interest include: the front-side illumination, the trenches, and the highly-doped silicon substrate.

In one aspect of the present disclosure, the electrical isolation among the SPADs is obtained by physically segmenting the substrate to form so-called SPAD "cubes". The same trenches used for the front side isolation may serve to this purpose. As a non-limiting example, the trenches may reach the backside surface interrupting the silicon layer between SPADs from top to bottom. The trenches may be filled with an isolating material and, possibly, also with a reflective/absorbing material.

The electrical connection of the SPADs may be achieved as follows. Because the substrate is highly doped, it creates a good conductive channel from the lower side of the active area to the backside surface onto which a metal electrode is placed for each SPAD. The front side (e.g., light entrance side) connection between the SPADs can be done in the same fashion as for the normal SiPM (e.g., by shorting the SPADs all together). Depending on the electronics architecture bonded on the backside, the quenching resistor on the front side maybe present or not.

This through-silicon trench isolation scheme enables another interesting possibility concerning the connection of the front-side layer. In particular, one (or more) SPADs can be converted into a conductive channels going from front to back side. In a possible implementation, this can be achieved simply by replacing the shallow junction with an ohmic contact. The metal lines on the front coming from each SPAD may converge to this "contact cube", which is accessible from the backside. The epi layer may add an undesirable series resistance which can be reduced, for example, by proper diffusion/implantation layers which will increase locally the dopant concentration.

In another possible implementation, the trenches for optical isolation are etched during the SPAD array fabrication process to a depth of about 10-30 um and filled with dielectric layers. The trench may feature a slight V-shape to facilitate a complete filling. At the end of the SPAD manufacturing the silicon wafer is permanently bonded to a glass wafer from the front side. The glass wafer serves as a mechanical support for the following steps as well as the light-entrance window. At this point, the silicon wafer is thinned down to reach the bottom of the trenches. This allows the creation of the cubes. Final process steps on the backside are aimed at creating the contact pads, for example: dielectric deposition, contact opening, metal deposition, and patterning.

As an alternative to the glass wafer, one can use a silicon wafer but attached by temporary bonding. Such a silicon wafer will then be removed after hybrid bonding of the backside to a CMOS wafer. The CMOS wafer will act also as a mechanical support for the SPAD array.

As a possible alternative to the epitaxial silicon wafer, one can use a Silicon on-Insulator (SOI) wafer. The top silicon layer of the SOI wafer will have the same features as the previous epi layer but further include a highly doped region close to the buried silicon dioxide. The trenches for SPAD isolation will land at or near the inner oxide layer. The silicon below the buried oxide layer has no predetermined electrical characteristics since it will be completely removed during wafer thinning. The main advantage of using a SOI material is that the cubes have a pre-defined and controlled thickness. Furthermore, at the completion of the thinning process, there is a flat and continuous oxide layer making the structure more stable from a mechanical point of view.

Another aspect of the present disclosure is to provide a semiconductor device having one or more conductive vias that extend into the SPAD or mini-SiPM structure. In some embodiments, the conductive columns may extend from a backside of the device into a doped region of the wafer. The conductive columns may be separated from one another by trenches that partially extend through the wafer. The conductive columns may be filled with an electrically-conductive material and may be surrounded on their sides by a dielectric material to isolate the conductive material from other doped regions in the wafer.

Another aspect of the present disclosure is to create arrays of mini-SiPMs (SPADs in parallel) having a pitch ranging from about 0.1 to 1 mm. In a possible implementation, dedicated trenches in silicon are used to separate the mini-SiPMs. The trench for optical isolation inside the mini-SiPM has the same depth and configuration as in a normal SiPM. The trench used for the cube separation, which surrounds each mini-SiPM, is optimized independently to this purpose. The process technology may follow the same steps as in any of the SPAD implementations depicted and described herein.

Figure 1:
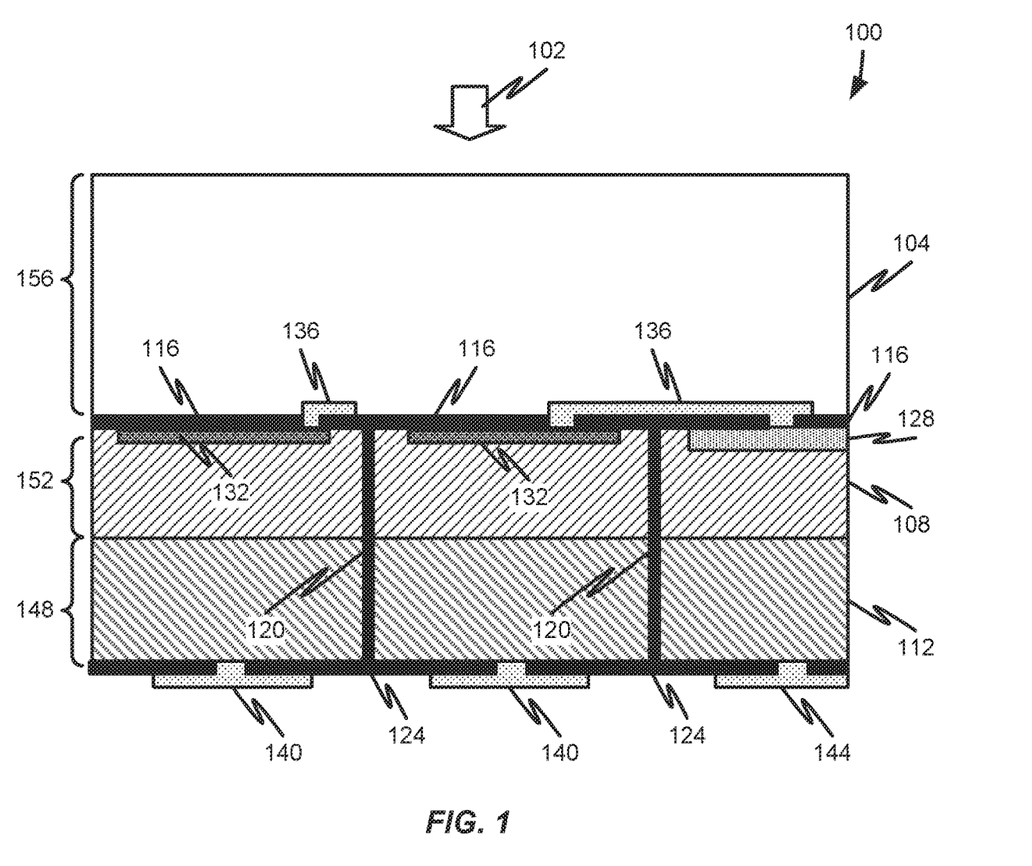
FIG. 1 is a cross-sectional view of a semiconductor device according to at least some embodiments of the present disclosure.

With reference now to FIG. 1, a first illustrative semiconductor device 100 will be described in accordance with at least some embodiments of the present disclosure. The device 100 is shown to include a wafer 104, transparent to electromagnetic radiation, that supports an epitaxial silicon among other layers. In some embodiments, the epi silicon is divided into a first portion of a silicon substrate 108 (e.g., "epi layer") and a second portion of the silicon substrate 112. In the depicted embodiment, the wafer 104 has a first side and an opposing second side. The first side faces toward incident light 102 and, therefore, may be referred to as a light entrance side of the semiconductor device 100. The second side of the wafer 104 is adjacent to the epi layer and, in some embodiments, may provide structural support to the portions 108, 112 of the silicon substrate.

Between the second portion of the silicon substrate 108 and the wafer 104 are provided a plurality of junctions 132. Each junction 132 is shown to reside at the top of portion 108, but such a configuration is not required. Rather, a junction 132 may reside anywhere within portion 108. For example, a junction 132 may be positioned in the middle of portion 108 or at the bottom of portion 108, which is nearer the portion 112 than wafer 104. Each junction 132 may operate as an electron multiplication region or the like. In other words, placement of the junction 132 can be anywhere within portion 108, which is may also be referred to as the active region of the epitaxial silicon. As will be discussed in further detail herein, a junction 132 may be provided in each SPAD, where SPADs are separated from one another by trenches 120. In some embodiments, each SPAD may be in electrical communication with a top-side contact 136 that extends through interrupts in a dielectric layer 116. One of the top-side contacts 136 may also be in electrical communication with a common top-side electrode 128. The construction of electrode 128 may be similar to junctions 132 with the difference being that electrode 128 is provided in a volume of silicon that does not operate as an SPAD.

The junctions 132 may be electrically and optically isolated from one another by one or more trenches 120 that extend completely through the first portion of the silicon substrate 108 and the second portion of the silicon substrate 112. Thus, each SPAD may be electrically and optically isolated from adjacent SPAD as well. The trenches 120 may extend from the dielectric layer 116 to a backside dielectric 124. In some embodiments, the trenches 120 provide an electrical and optical isolation mechanism in addition to defining an SPAD. More specifically, a pair of trenches 120 may have a three-dimensional volume of silicon defined there between. The volume of the silicon sandwiched between trenches 120 may include a first portion 108 and second portion 112 and extends between a single junction 132 and a single (corresponding) contact 140. Thus, when a photon triggers an SPAD, an electrical current is generated at the corresponding contact 140 underlying the SPAD that received the photon. Because the trenches 120 extend all the way through the volume of the SPAD down to the backside dielectric 124, the possibility of optical cross-talk between one SPAD and another SPAD is minimized.

The shape and nature of the trenches 120 may have a number of different characteristics. For example, the 3D volume of an SPAD may be defined by four (4) discrete trenches 120 that orthogonally intersect one another. Said another way, when viewed from the top of the device 100, the trenches 120 may appear to create an array of square SPAD cube structures. In other embodiments, the trenches 120 may not necessarily be straight walls extending through the epi layer. For instance, the trenches 120 may be circularly or elliptically-shaped when viewed from above, which means that a single trench 120 may encircle a 3D SPAD volume, which would then have a shape other than a cube shape. For example, the trenches 120 may have any type of polygonal structure or shape without departing from the scope of the present disclosure. It should be appreciated that cube shapes are probably most suitable for maximizing the fill factor of the device 100.

In some embodiments, an SPAD cube structure may have a width and length of between 5 and 100 um. This width and length may correspond to the linear distance between adjacent trenches 120 and may be referred to as an SPAD pitch. The combined dimension of the first thickness 152 and second thickness 148 may be between 5 and 100 um.

The individual junctions 132 are also independently capable of producing electrons that travel to their corresponding contact 140, which can then carry electrical current to an external circuit element, such as an Application Specific Integrated Circuit (ASIC). The backside dielectric 124 may be used to enclose the bottom of the SPAD and the backside dielectric may have vias or holes provided therein that expose each independent SPAD to their corresponding contact 140. In some embodiments, the plurality of SPADs are connected together via top side contacts 136. Each SPAD may be connected to the top side contacts 136 via a dedicated quenching resistor or the like (not shown). The common top electrode 136 is connected to the electrode 144 via a low-resistance path through the silicon. This low resistive path is created together with the SPADs, but replacing the junction 132 with an ohmic contact 128. It should also be noted that in the case of Near-Infrared light (which has a long absorption length in Si), the metal layer used for the contact 140 can serve as a reflector to enhance the absorption probability in the epi layer 108. To such a purpose, the metal may be configured to more than 50% of the back surface of the device 100. It should also be appreciated that multiple SPADs can be connected together with the metal layer 140 to form mini-SiPMs.

The wafer 104 may correspond to a structure that physically protects the other components of the semiconductor device 100 from environmental hazards, but that permits light (e.g., photons) or the like to pass there through and be detected by the photosensitive areas of the SPADs (e.g., portion 108). As will be discussed in further detail herein, the wafer 104 may correspond to a glass or other type of material that assists with the production of device 100, but also enables the junctions 132 to be positioned at the top side of the silicon (e.g., somewhere within the first portion of the silicon substrate 108), which is nearest the incident light 102. This is considered a better alternative than burying the junctions 132 at the backside of the silicon, much like with the BSI approach. Advantageously, however, the semiconductor device 100 is produced such that each SPAD can be accessed with an external circuit by the contacts 140, which are positioned on the backside of the second portion of the silicon 112. This effectively enables solder bump connectivity between the device 100 and an external circuit device, such as an ASIC. Furthermore, this backside connectivity is achieved without having to extend conductive TSVs through the entirety of the substrate 108, 112, which would consume significantly more space and reduce the overall sensitivity of the device 100 to light 102. The thickness 156 of the support wafer 104 may be greater than the combination of the first and second thicknesses 148, 152. For instance, the thickness 156 of the support wafer 104 may be at least 50 um and can be as large as 300 um without departing from the scope of the present disclosure.

In accordance with at least some embodiments, the silicon wafer may correspond to a semiconductor material that has a first doping (e.g., an n or p-type doping) The first portion, 108, may correspond to a lowly doped region of the first doping (e.g., an n or p-type doping) and the second portion 112 may correspond to a highly doped region of the first doping (e.g., an n or p-type doping). As a non-limiting example, one or both portions 108, 112 may be formed from any known type of semiconductor material (e.g., GaAs, GAP, or any other Group IV or Group V semiconductor) and, in some embodiments, the same layer of material may be doped differently between the first portion 108 and second portion 112. Any suitable type of known doping process or sequence of steps can be used to create the portions 108, 112.

The junction 132 may correspond to any material or combination of materials, in a layered or unlayered format, that enables the production of a multitude of carriers in response to receiving one or more photons at the photosensitive area (e.g., the first portion 108). Suitable examples of materials that can be used for the junctions 132 may include, without limitation, Si, Ge, InGaAs, PbS, MCT, or the like.

When a photon travels through silicon, the photon may be absorbed and transfer energy to a bound electron within the first portion 108. This absorbed energy causes the electron to move from the valence band into the conduction band, creating an electron-hole pair. Silicon can absorb a wide range of wavelengths of light within a depth of a few tens of microns and so is well-suited as a photodetector material.

Applying a reverse bias to a photodiode sets up an electric field across the depletion region (e.g., portion 108) that will cause these charge carriers to the accelerated towards the anode (holes), or cathode (electrons). Therefore, an absorbed photon will result in a net flow of current in a reverse-biased photodiode.

When a sufficiently high electric field (>3×105 V/cm) is generated within the junction 132, a charge carrier will be accelerated to a point where it carries sufficient kinetic energy to create secondary charge pairs through a process called impact ionization. When the multiplication diverges, a single absorbed photon in the depletion region (e.g., portion 108) can trigger an ionization cascade confined within the SPAD (e.g., the volume of silicon that is enclosed by the trenches 120, backside dielectric 124, and dielectric 116). The silicon will break down and become conductive, effectively amplifying the original electron-hole pair into a macroscopic current flow. The current flow created in the junction 132 will travel down through the SPAD (e.g., silicon portions 108, 112) and then the contact 140 will receive the current through a via established in the backside dielectric 124.

Although not visible in the cross-sectional view, a person of ordinary skill in the art will appreciate that the contacts 136 may be part of a larger metal grid that connects all of the different SPADs together in a circuit. Specifically, the semiconductor device 100 may include a plurality of SPADs laid out in an array or grid-type pattern and a corresponding grid of metal lines or traces 136 may be provided throughout the array.

Figure 2A:
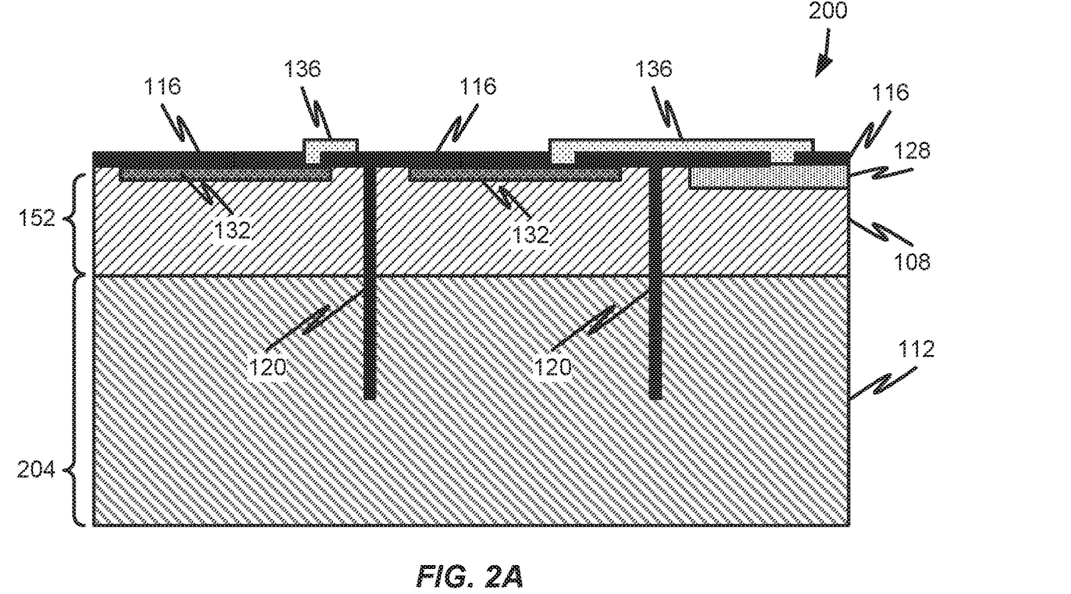
FIG. 2A is a cross-sectional view of a first intermediate product used for constructing a first example sensor according to at least some embodiments of the present disclosure.

With reference now to FIGS. 2A-D, one possible, but non-limiting, method of producing a semiconductor device 100 and then a sensor that includes the semiconductor device 100 will be described in accordance with at least some embodiments of the present disclosure. As shown in FIG. 2A, a first intermediate product 200 includes a number of the components depicted in FIG. 1. In particular, the first intermediate product 200 includes the top-side contacts 136 arranged in a grid-type pattern over the semiconductors layers (e.g., portions 108, 112). The contacts 136 are positioned on the top-side dielectric layer 116. A number of vias provided within the top-side dielectric layer 116 provide access between individual SPADs and the top-side contacts 136. A plurality of trenches 120 extend 120 through the first portion 108 and second portion 112. The trenches 120 may correspond to voids in the material of the silicon and may be filled with non-conductive and/or optically-opaque material. As one example, the trenches 120 may be constructed from the same or similar material as the dielectric layer 116.

A person of ordinary skill in the art may appreciate that the first intermediate product 200 resembles a "standard" SiPM in which trenches 120 do not extend entirely through the portions 108, 112 to the bottom side of the second portion 112. Rather, first portion 108 may have its first thickness 152, but the second portion 112 may have an original thickness 204 that is greater than its final thickness 148 in the semiconductor device 100. In some embodiments, the combination of thicknesses 152, 204 may be between 500 and 800 um.

Figure 2B:
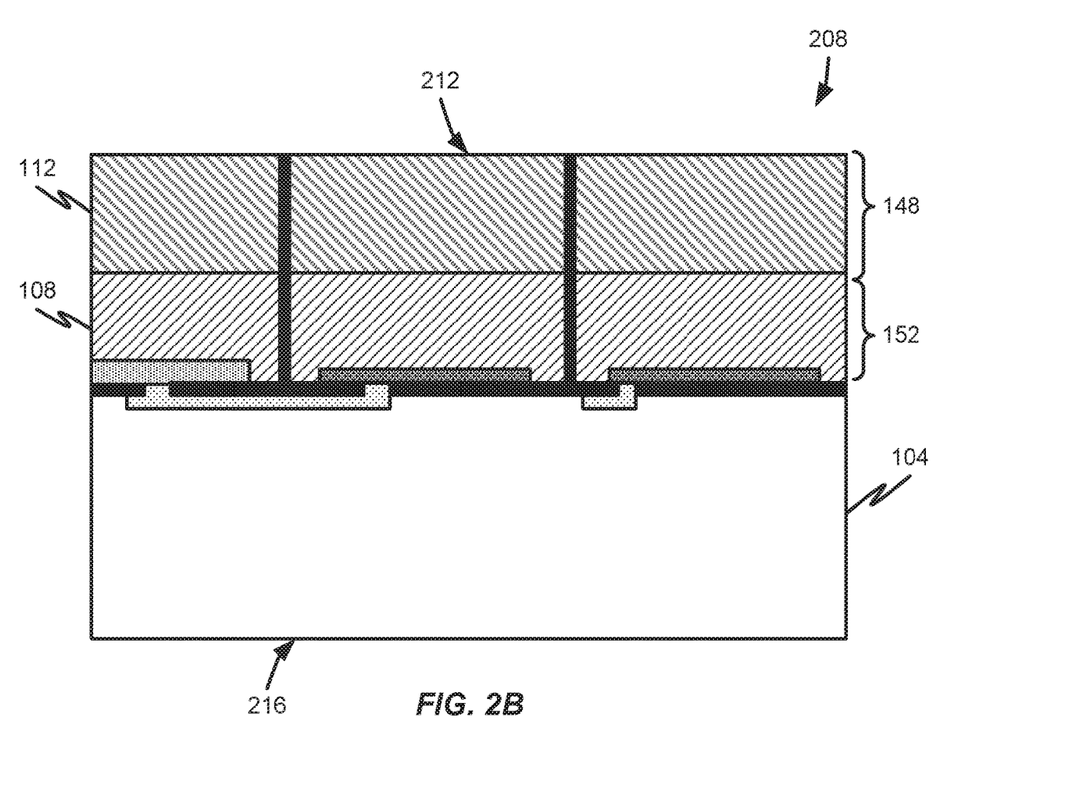
FIG. 2B is a cross-sectional view of a second intermediate product used for constructing the first example sensor.

As shown in FIG. 2B, the portion 108 may have the wafer 104 attached thereto and then the portion 112 is thinned down (e.g., via etching, grinding, or any other chemical/mechanical process) to its second thickness 148 to produce a second intermediate product 208. The second portion 112 is thinned down until the trenches 120 are reached. In some embodiments, the support wafer 104 is connected to the top-side of the epi layer prior to thinning the second portion 112 as a support structure for the epi layer, which is now much thinner than original. The exposed surface of the support wafer 104 may correspond to a light entrance side 216 whereas the thinned surface of the second portion 112 may correspond to the backside 212.

Figure 2C:
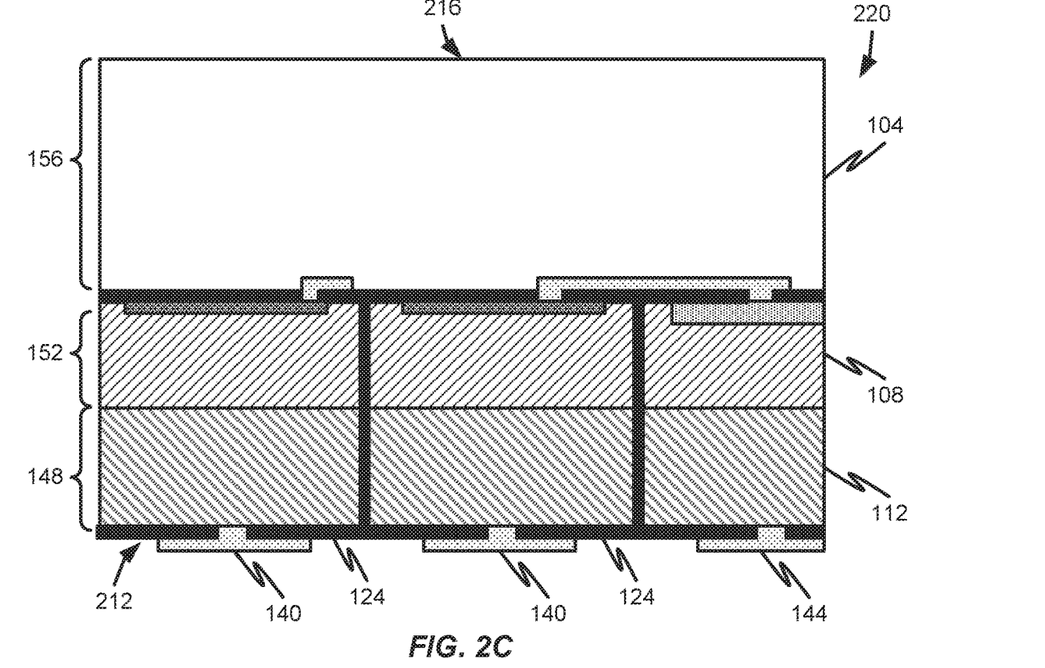
FIG. 2C is a cross-sectional view of a third intermediate product used for constructing the first example sensor.

As shown in FIG. 2C, the production process continues by creating a dielectric on the backside 212 of the second intermediate product 208 to produce a third intermediate product 220. The third intermediate product 220 may correspond to the semiconductor device 100. The process may further include establishing vias in the backside dielectric 124 and then creating the backside metal contacts 140, 144 over those vias. The components created during this step of manufacture may utilize known CMOS processes or any other type of known process.

Figure 2D:
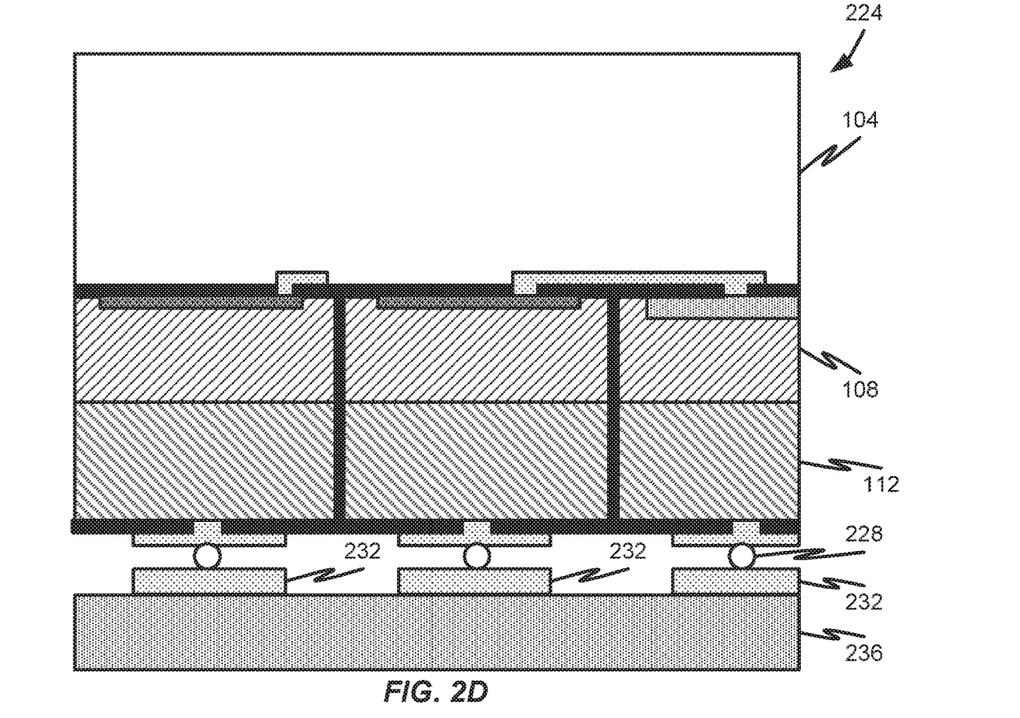
FIG. 2D is a cross-sectional view of the first example sensor.

FIG. 2D depicts an illustrative sensor 220 that may include the semiconductor device 100. In particular, the backside metal contacts 140, 144 are placed into electrical communication with one another and/or with an external circuit device 236. Because the contacts 140, 144 are positioned at the backside 212 of the device 100, the electrical connection between the device 100 and external circuit device 236 may be achieved with solder bumps 228 (e.g., solder balls or discrete deposits of electrically-conductive material) or hybrid bonding. The external circuit device 236 may have a plurality of contact pads 232 that interface with some or all of the backside metal contacts 140, 144. The external circuit device 236 may correspond to an ASIC or other type of integrated circuit device. In a design where there are one or more SPADs connected in parallel with one another by backside contacts 140, thereby forming one or more mini-SiPMs), the connection to the external circuit device 236 will have a lower ball density, meaning that the external circuit device 236 may connect to only a subset of the backside contacts 140, 144 via solder bumps 228.

Figure 3A:
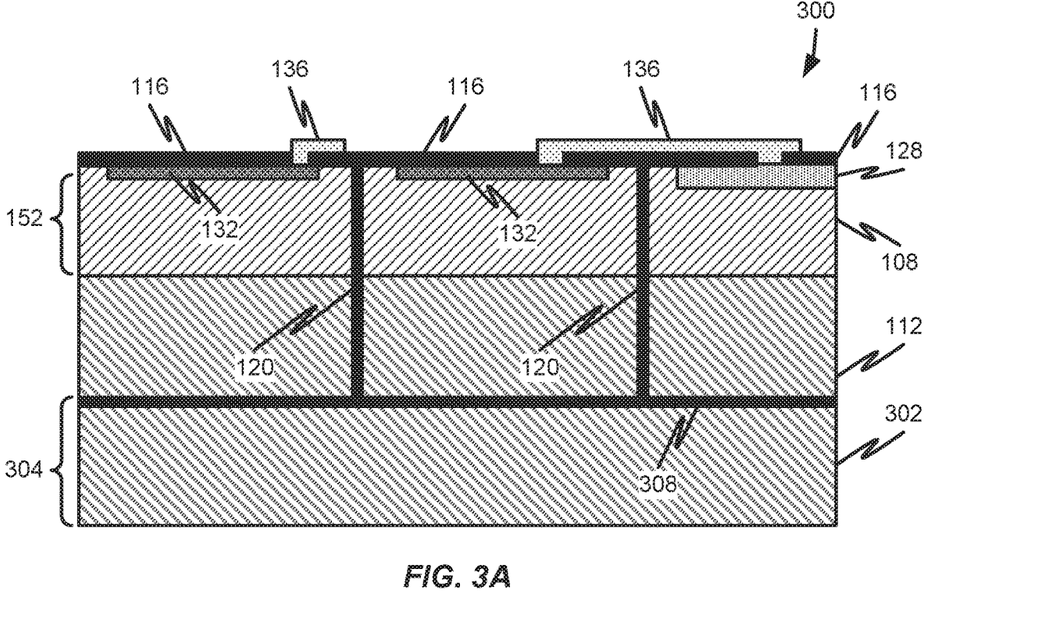
FIG. 3A is a cross-sectional view of a first intermediate product used for constructing a second example sensor according to at least some embodiments of the present disclosure.

With reference now to FIGS. 3A-D, another possible, but non-limiting, method of producing a semiconductor device 100 and then a sensor that includes the semiconductor device 100 will be described in accordance with at least some embodiments of the present disclosure. As shown in FIG. 3A, a first intermediate product 300 is provided with a number of similar features to the first intermediate product 200. One difference between intermediate products, 200, 300 is that the first intermediate product 300 includes a silicon oxide layer 308 built on top of a sacrificial silicon portion 302. In this embodiment, the silicon built on top of the oxide layer 308 (e.g. portions 108 and 112) has a changing doping from high to low. Thus, the second portion 112 represents the highly doped portion of silicon whereas the first portion 108 represents the lowly doped portion of the silicon. The sacrificial silicon portion 302 may have a thickness 304 that is between 600 and 800 um. This particular construction may represent a SOI wafer approach where the silicon oxide layer 308 can be pre-positioned within the silicon rather than being created after the etching of the silicon.

Figure 3B:
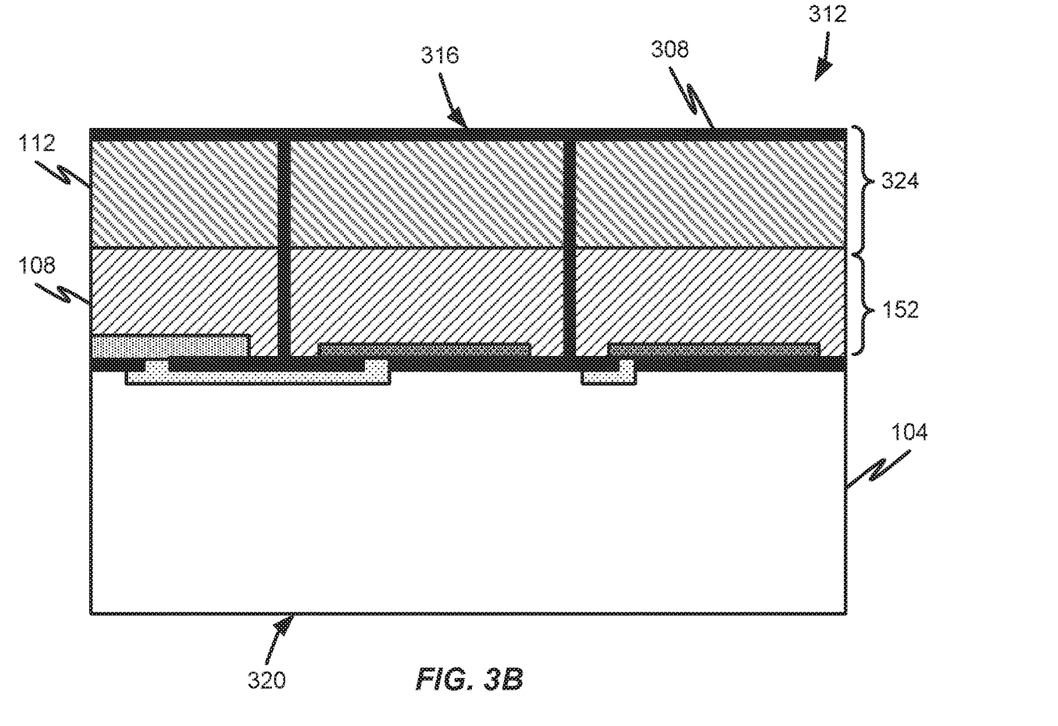
FIG. 3B is a cross-sectional view of a second intermediate product used for constructing the second example sensor.

As shown in FIG. 3B, the wafer 104 may be attached to the silicon and then the sacrificial portion 302 may be thinned down or removed (e.g., via etching, grinding, or any other chemical/mechanical process) to produce a second intermediate product 312. The sacrificial portion 302 is thinned down until the silicon oxide 308 is reached. Thus, the silicon oxide 308 may represent an endpoint for the etching process and the final thickness 324 of the second portion 112 may be similar (e.g., within a couple of microns) or identical to the second thickness 148. The silicon oxide 308 may also structurally reinforce the silicon structure. The exposed surface of the wafer 104 may correspond to a light entrance side 320 whereas the silicon oxide 308 may be positioned at the backside 316.

Figure 3C:
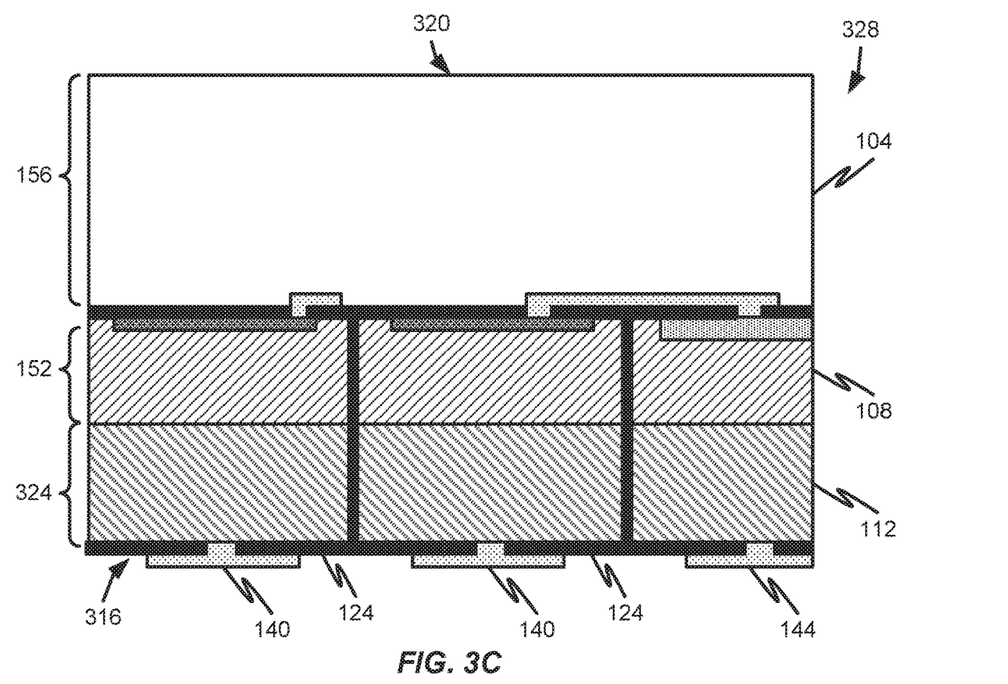
FIG. 3C is a cross-sectional view of a third intermediate product used for constructing the second example sensor.

As shown in FIG. 3C, the process continues by producing a third intermediate product 328. The third intermediate product 328 may correspond to the semiconductor device 100. The process may further include establishing vias in the backside silicon oxide layer 308 and then creating the backside metal contacts 140, 144 over those vias. It should be appreciated that the silicon oxide 308 effectively operates as the backside dielectric 124. The components created during this step of manufacture may utilize known CMOS processes or any other type of known process.

Figure 3D:
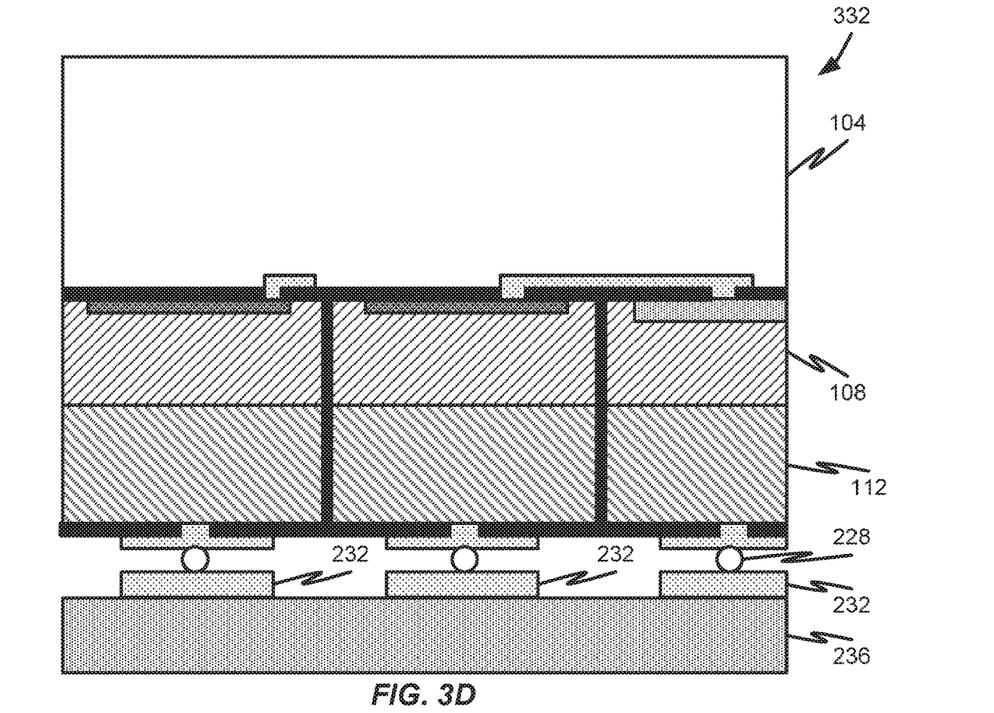
FIG. 3D is a cross-sectional view of the second example sensor.

FIG. 3D depicts an illustrative sensor 332 that may include the semiconductor device 100. In particular, the backside metal contacts 140, 144 are placed into electrical communication with an external circuit device 236. Again, the positioning of the contacts 140, 144 facilitates a flip-chip type of connection with the external circuit device 236 rather than requiring conductive wires or the like. Also, as with other sensor designs depicted and described herein, one or more of the SPADs may be connected in parallel with one another via the backside contacts and then others of the contacts 104, 144 may be connected with the external circuit device 236.

Figure 4A:
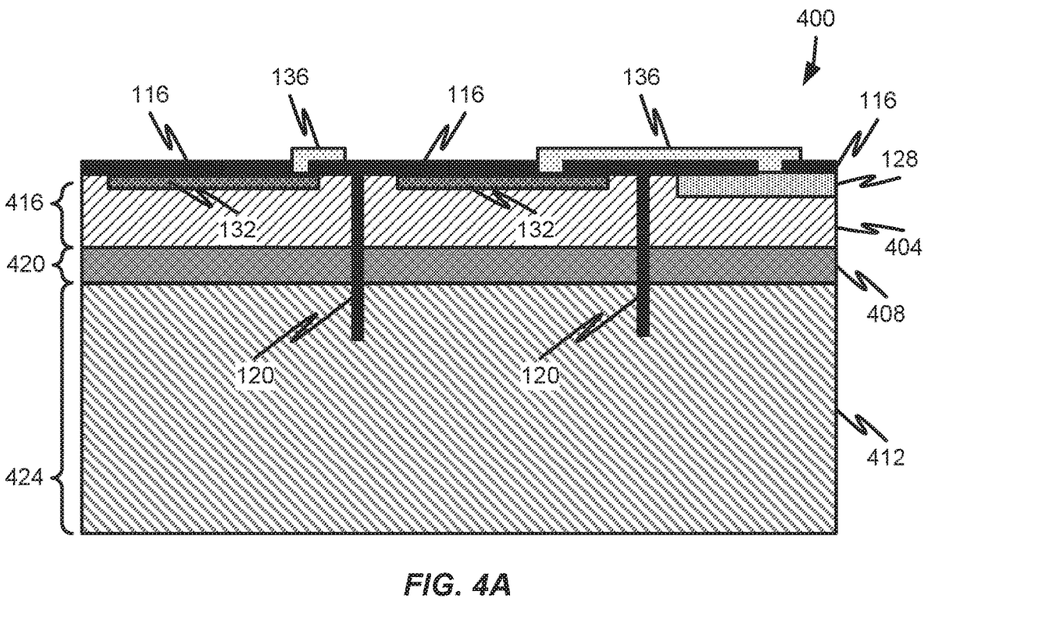
FIG. 4A is a cross-sectional view of a first intermediate product used for constructing a third example sensor according to at least some embodiments of the present disclosure.

With reference now to FIGS. 4A-D, another possible, but non-limiting, method of producing a semiconductor device and then a sensor that includes the semiconductor device will be described in accordance with at least some embodiments of the present disclosure. As shown in FIG. 4A, a first intermediate product 400 is provided with a number of similar features to the first intermediate product 200. One difference between intermediate products, 200, 400 is that the first intermediate product 400 includes a first doped portion 404, a second doped portion 408, and a third doped portion 412. These different doped portions may each have an original thickness 416, 420, 424, respectively. The trenches 120 are shown to extend completely through the first and second doped portions 404, 408 and then partially extend into the third doped portion 412. The combined thickness of 416, 420, and 424 may be on the order of 500 to 800 um. The starting thickness 424 of the third doped portion 412 is greater than the eventual final thickness of the third doped portion 412.

In some embodiments, the first doped portion 404 corresponds to a region of the silicon having a first type of doping (e.g., an n-type doping). The second doped portion 408 may correspond to a region having a heavier doping of the same type as the first doped portion 404 (e.g., an n+ type doping). The third doped portion 412 may correspond to a region having an opposite doping from the first and second portions 404, 408 (e.g., a p-type doping or a p+ type doping).

Figure 4B:
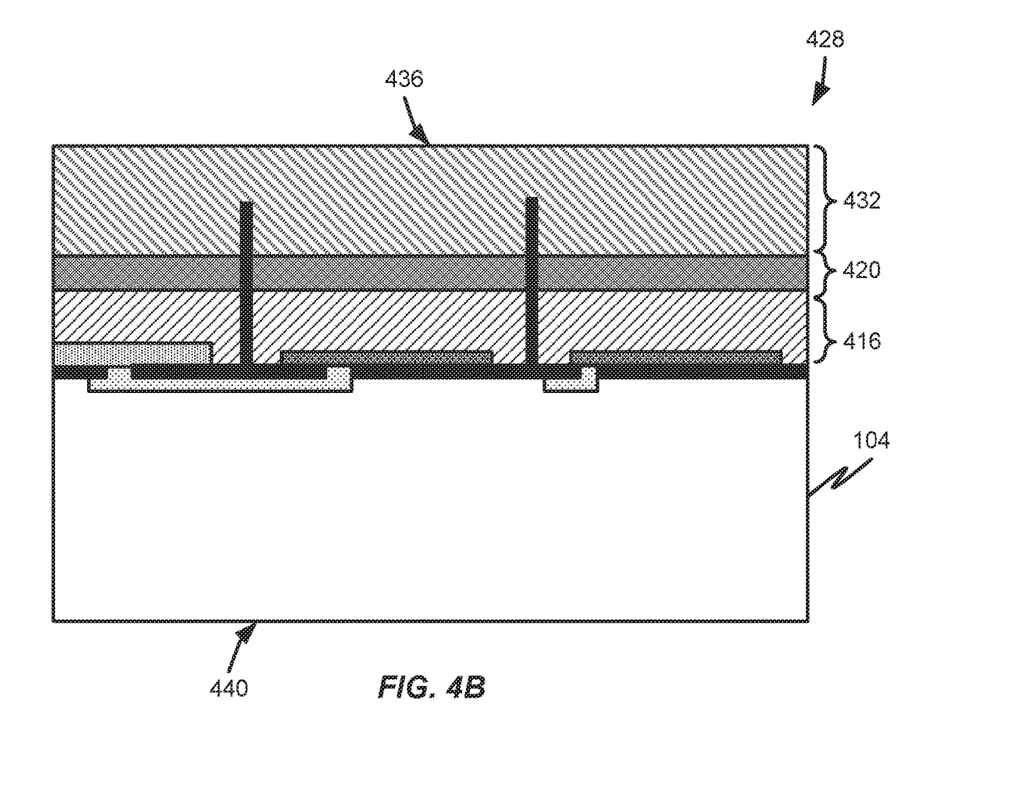
FIG. 4B is a cross-sectional view of a second intermediate product used for constructing the third example sensor.

As shown in FIG. 4B, the support wafer 104 may be connected to the silicon and then the third portion 412 of may be thinned down (e.g., via etching, grinding, or any other chemical/mechanical process) to its finished thickness 432 to produce a second intermediate product 428. The third portion 412 is thinned down until the combination of thicknesses 416, 420, 432 is on the order of 10 to 50 um. The exposed surface of the wafer 104 may correspond to a light entrance side 440 whereas the thinned surface of the third portion 412 of the epi layer may correspond to the backside 436.

Figure 4C:
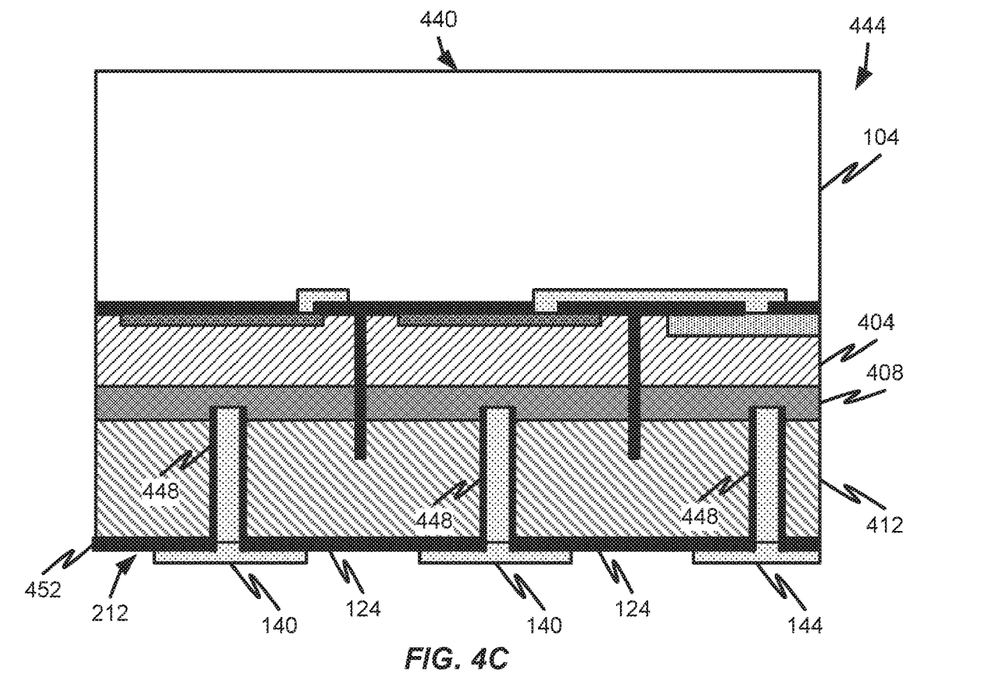
FIG. 4C is a cross-sectional view of a third intermediate product used for constructing the third example sensor.

As shown in FIG. 4C, the process continues by producing a third intermediate product 444. The third intermediate product 444 may correspond to another variation of a semiconductor device. The process may further include establishing vias in the backside silicon oxide layer 452 and then creating the backside metal contacts 140, 144 over those vias. In this particular embodiment, the vias created in the backside silicon oxide layer 452 may extend to conductive columns 448 to reach portion 408. The conductive columns 448 may be filled with electrically-conductive material and be surrounded on their sides by dielectric material 452 to isolate them from portion 412. It should be appreciated that the silicon oxide 452 effectively operates as the backside dielectric 124. The conductive columns 448 may extend completely through the third doped portion 412 and be exposed in the second doped portion 408. In some embodiments, the conductive ends of the columns 448 are exposed within the second doped portion 408. In this production method, the electrical isolation between the backside of the SPADs is provided by the junction formed by layers 408 and 412. This is why isolation between the metal of the contact and the layer 412 is desirable. Another way to isolate the contact to the layer 412 common to two SPADs is by creating a trench around each contact reaching layer 408.

The components created during this step of manufacture may utilize known CMOS processes or any other type of known process.

Figure 4D:
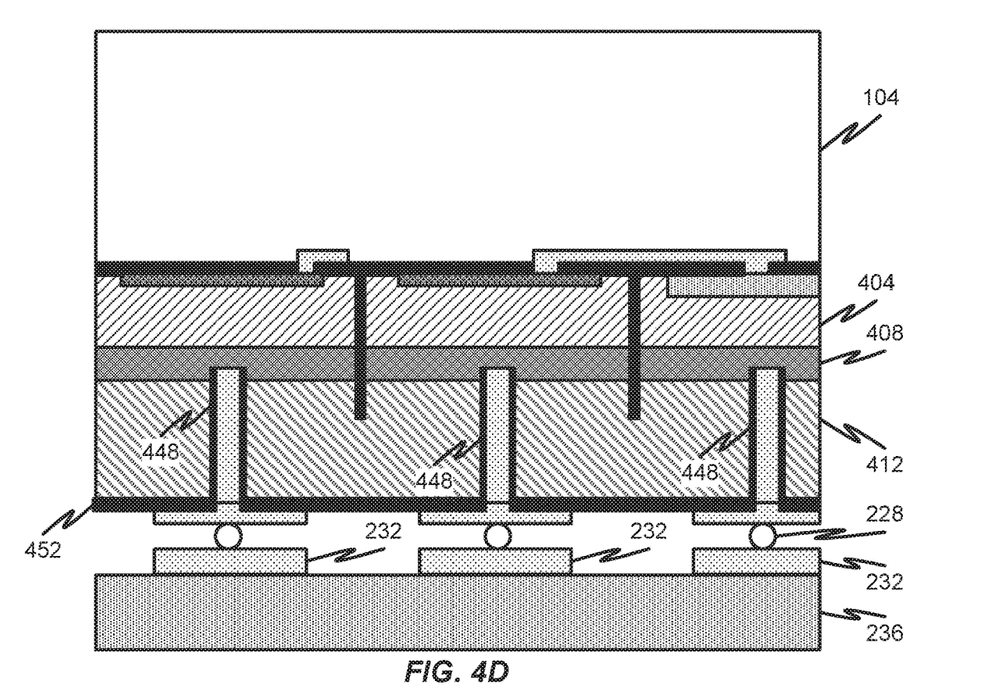
FIG. 4D is a cross-sectional view of the third example sensor.

FIG. 4D depicts an illustrative sensor that may include the semiconductor device produces as the third intermediate product 444. In particular, the backside metal contacts 140, 144 are placed into electrical communication with an external circuit device 236. Again, the positioning of the contacts 140, 144 facilitates a flip-chip type of connection with the external circuit device 236 rather than requiring conductive wires or the like. Furthermore, one or more of the SPADs of device 444 may be connected together in parallel. Thus, only a subset of the contacts 140, 144 may be used for connection with the external circuit device 236.

Figure 5:
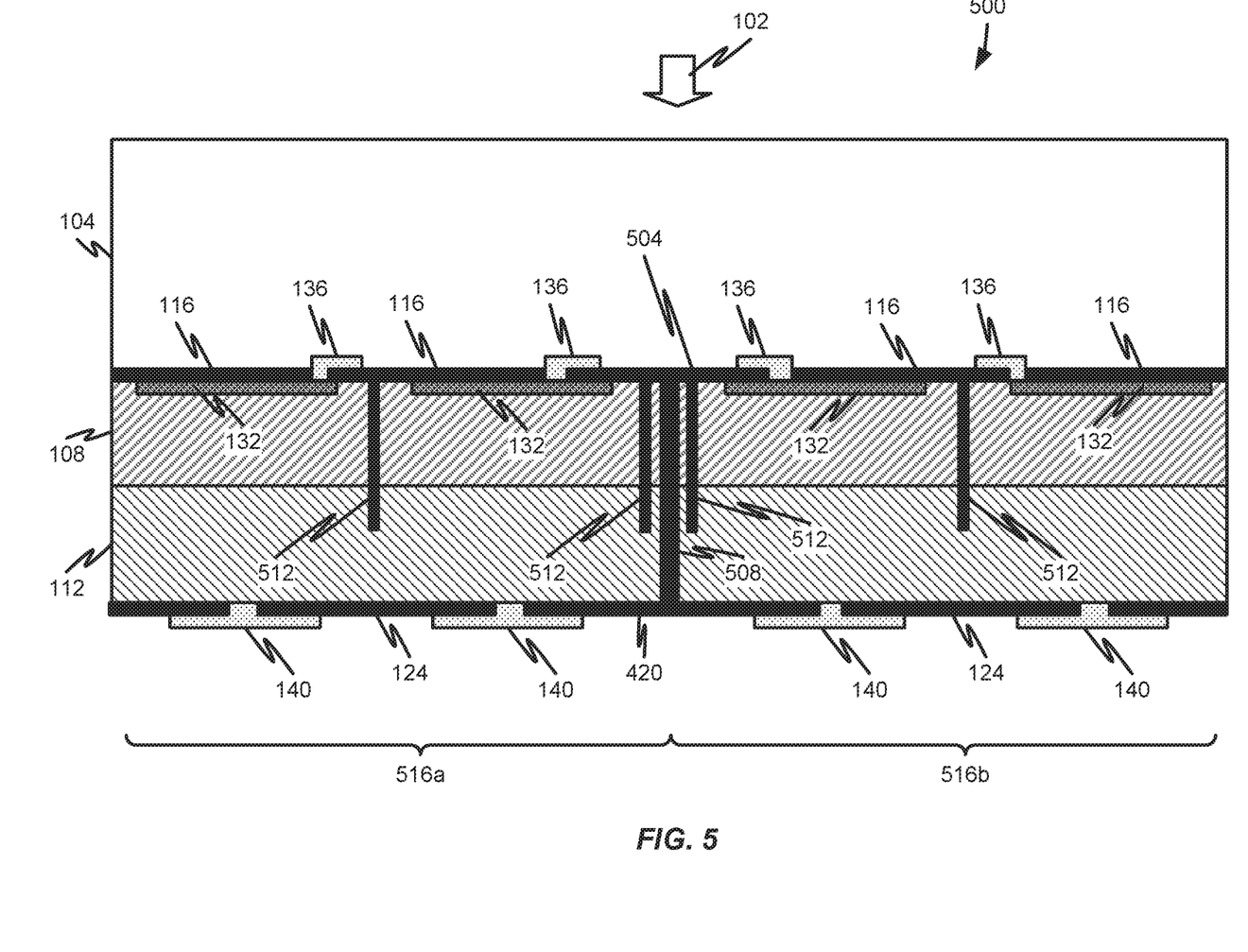
FIG. 5 is a cross-sectional view of an alternative semiconductor device according to at least some embodiments of the present disclosure.

FIG. 5 depicts an illustrative semiconductor device 500 that may be produced in accordance with at least some embodiments of the present disclosure. The semiconductor device 500 may be used as a as part of a sensor rather than using device 100 in any of the sensors depicted and described herein. For instance, sensors 224 and/or 332 may utilize the semiconductor device 500 rather than device 100.

The semiconductor device 500 includes a plurality of mini-SiPMs 516a, 516b. Although only two mini-SiPMs are shown, it should be appreciated that a semiconductor device 500 may include a large number (e.g., 20 or more) of mini-SiPMs without departing from the scope of the present disclosure. This application is one in which it is desirable to access multiple SPADs with one or multiple backside contacts 140. The SPADs belonging to a mini-SiPM 516 are connected in parallel, on the front side through a resistor and metal 136, while on the backside through the layer 112. In some embodiments, also the top side of of different mini-SiPMs 516a, 516b are all connected together by the layer 136.

One aspect of this particular embodiment is to use the standard processing with shallow trenches 512 and then additionally separate each mini-SiPM with deeper isolation trenches 508 that extend entirely through the semiconductor (e.g., the entirety of the first portion 108 and second portion 112). The construction of the isolation trench 508 and shallower trenches 512 may be similar, but the depth of the isolation trench 508 is larger than the depth of the isolation trenches 512. In some embodiments, the isolation trench 508 can be repeated every 200, 500 um or even larger pitch whereas the pitch between the shallower trenches 512 is on the order of 5 to 100 um. This effectively creates multiple SPADs within a single pixel. Each mini-SiPM 516a, 516b effectively represents a different pixel for the device 500 or a sensor that includes the device 500. In some embodiments, it may be possible to utilize a single contact for each mini-SiPM. In this example, the shallower isolation trench 512 may be used for optical isolation between SPADs whereas the deeper isolation trench 508 is used for device isolation (e.g., to electrically isolate adjacent pixels from one another). Said another way, the shallower isolation trench 512 may be used for single-sided electrical and optical isolation between at least two SPADs belonging to a common mini-SiPM whereas the deeper trench 508 may be used to electrically and optically isolate SPADs belonging to different mini-SiPMs.

As can be appreciated, any of the semiconductor devices depicted and described herein may be implemented as on-chip solutions (e.g., as a single silicon wafer). In some embodiments, the silicon photomultiplier may be implemented in an Integrated Circuit (IC) chip having other circuit elements provided therein.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A semiconductor device, comprising:
   a silicon substrate having a first side and an opposing second side;
   a first Single Photon Avalanche Diode (SPAD) provided in the silicon substrate;
   a second SPAD provided in the silicon substrate and also positioned adjacent to the first SPAD;
   at least one trench that electrically isolates the first SPAD from the second SPAD by extending from the first side of the silicon substrate to the second side of the silicon substrate, wherein the at least one trench begins at the first side of the silicon substrate and extends through both an n-doped portion of the silicon substrate and a p-doped portion of the silicon substrate all the way through the silicon substrate;
   at least one backside contact positioned in proximity to the second side of the silicon substrate, wherein the at least one backside contact receives an electrical signal that is responsive to either the first SPAD or second SPAD receiving a photon; and
   an additional contact positioned in proximity to the second side of the silicon substrate, wherein the additional contact is electrically connected to the first side of the silicon substrate by a Through Silicon Via (TSV), and wherein the TSV is isolated from the first SPAD and second SPAD by the at least one trench.

2. The semiconductor device of claim 1, wherein the silicon substrate comprises a highly doped silicon material.

3. The semiconductor device of claim 1, further comprising:
   a dielectric layer substantially adjacent to the second side of the silicon substrate, wherein the at least one trench extends to and contacts the dielectric layer.

4. The semiconductor device of claim 3, wherein the at least one backside contact is formed directly on the dielectric layer.

5. The semiconductor device of claim 1, wherein the at least one backside contact comprises a first contact and a second contact, wherein the first contact receives a first electrical signal from the first SPAD, wherein the second contact receives a second electrical signal from the second SPAD, and wherein the first contact is electrically isolated from the second contact.

6. The semiconductor device of claim 1, wherein the first SPAD belongs to a first mini-Silicon Photomultiplier (SiPM), wherein the second SPAD belongs to a second mini-SiPM, and wherein the first mini-SiPM is electrically isolated from the second mini-SiPM by the at least one trench.

7. The semiconductor device of claim 6, wherein the at least one trench comprises a first trench that provides electrical and optical isolation between the first mini-SiPM and the second mini-SiPM and wherein the at least one trench further comprises a second trench that provides single-sided electrical and optical isolation between at least two SPADs belonging to the first mini-SiPM.

8. The semiconductor device of claim 7, wherein the first trench is longer than the second trench.

9. The semiconductor device of claim 1, wherein a distance between the first side and the second side is no more than approximately 50 microns.

10. A sensor, comprising:
at least one Single Photon Avalanche Diode (SPAD) cube established in a substrate, the at least one SPAD cube comprising:
a photosensitive area that is configured to produce an electrical signal in response to light impacting the photosensitive area, wherein the photosensitive area is positioned at a first side of the at least one SPAD cube;
a contact that receives the electrical signal, wherein the contact is positioned at a second side of the at least one SPAD cube that opposes the first side of the at least one SPAD cube, wherein a distance from the first side of the at least one SPAD cube to the second side of the at least one SPAD cube is no more than 50 microns;
at least one trench that extends through an entire thickness of the substrate thereby electrically and optically isolating the at least one SPAD cube from adjacent SPAD cubes; and
an additional contact positioned in proximity to the second side of the at least one SPAD cube, wherein the additional contact is electrically connected to the first side of the at least one SPAD cube by a Through Silicon Via (TSV), and wherein the TSV is isolated from the at least one SPAD cube by the at least one trench.

11. The sensor of claim 10, further comprising:
an external circuit connected to the at least one SPAD cube by the contact.

12. The sensor of claim 11, wherein the external circuit comprises a contact pad that is electrically and physically connected to the contact of the at least one SPAD cube.

13. The sensor of claim 10, wherein the electrical signal travels through the substrate and wherein the substrate comprises doped silicon.

14. The sensor of claim 10, wherein the at least one trench comprises a length that is substantially equal to a thickness of the substrate.

15. The sensor of claim 10, wherein the at least one trench extends around all four sides of the at least one SPAD cube that connect the first side of the at least one SPAD cube to the second side of the at least one SPAD cube.

16. An array of Single Photon Avalanche Diode (SPAD) cubes, comprising:
a silicon substrate;
an array of photosensitive areas distributed across a first side of the silicon substrate, wherein each photosensitive area in the array of photosensitive areas is capable of producing an electrical signal in response to receiving light;
a plurality of contacts distributed across a second side of the silicon substrate, wherein at least some of the plurality of contacts are configured to receive electrical signals from some of the photosensitive areas and not others of the photosensitive areas;
at least one trench that extends from the first side of the silicon substrate all the way to the second side of the silicon substrate, that provides optical isolation between adjacent photosensitive areas in the array of photosensitive areas, and that provides electrical isolation between adjacent contacts in the plurality of contacts;
a dielectric layer substantially adjacent to the second side of the silicon substrate, wherein the at least one trench extends to and contacts the dielectric layer; and
an additional contact positioned in proximity to the second side of the silicon substrate, wherein the additional contact is electrically connected to the first side of the silicon substrate by a Through Silicon Via (TSV), and wherein the TSV is isolated from the array of photosensitive areas by the at least one trench.

17. The array of SPAD cubes of claim 16, wherein a length of the at least one trench is substantially equal to a thickness of the silicon substrate and wherein the thickness of the silicon substrate is no more than approximately 50 microns.

* * * * *